United States Patent
Mackey et al.

(10) Patent No.: US 6,894,765 B2
(45) Date of Patent: May 17, 2005

(54) METHODS AND SYSTEMS FOR CONTROLLING RADIATION BEAM CHARACTERISTICS FOR MICROLITHOGRAPHIC PROCESSING

(75) Inventors: Jeffrey L. Mackey, Boise, ID (US); William A. Stanton, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/684,794

(22) Filed: Oct. 14, 2003

(65) Prior Publication Data

US 2005/0078293 A1 Apr. 14, 2005

(51) Int. Cl.⁷ .......................... G03B 27/72; G03B 27/42
(52) U.S. Cl. .......................... 355/69; 355/53
(58) Field of Search .................. 355/52, 53, 55, 355/67–71; 430/22, 30

(56) References Cited

U.S. PATENT DOCUMENTS

| | | |
|---|---|---|
| 4,988,188 A | 1/1991 | Ohta |
| 5,142,132 A | 8/1992 | MacDonald et al. |
| 5,194,893 A | 3/1993 | Nishi |
| 5,300,971 A | 4/1994 | Kudo |
| 5,436,464 A | 7/1995 | Hayano et al. |
| 5,602,620 A | 2/1997 | Miyazaki et al. |
| 5,631,721 A | 5/1997 | Stanton et al. |
| 5,661,546 A | 8/1997 | Taniguchi |
| 5,684,566 A | 11/1997 | Stanton |
| 5,721,608 A | 2/1998 | Taniguchi |
| 5,796,467 A | 8/1998 | Suzuki |
| 5,907,392 A | 5/1999 | Makinouchi |
| 5,969,800 A | 10/1999 | Makinouchi |
| 6,084,244 A | 7/2000 | Saiki et al. |
| 6,188,464 B1 | 2/2001 | Makinouchi |
| 6,215,578 B1 | 4/2001 | Lin |
| 6,251,550 B1 | 6/2001 | Ishikawa |
| 6,259,513 B1 | 7/2001 | Gallatin et al. |
| 6,285,440 B1 | 9/2001 | Takahashi |
| 6,291,110 B1 | 9/2001 | Cooper et al. |
| 6,379,867 B1 | 4/2002 | Mei et al. |
| 6,392,740 B1 | 5/2002 | Shiraishi et al. |
| 6,498,685 B1 * | 12/2002 | Johnson ...................... 359/626 |

(Continued)

FOREIGN PATENT DOCUMENTS

JP          11-231234 A        8/1999

OTHER PUBLICATIONS

Optics.org, "Micronic and Fraunhofer Develop New Pattern Generators," 1 page, Dec. 10, 1999, <http://www.optics.org>.

(Continued)

*Primary Examiner*—Henry Hung Nguyen
(74) *Attorney, Agent, or Firm*—Perkins Coie LLP

(57) ABSTRACT

Methods and apparatuses for controlling characteristics of radiation directed to a microlithographic workpiece are disclosed. An apparatus in accordance with one embodiment of the invention includes a source of radiation positioned to direct a radiation beam having an amplitude distribution, a phase distribution, and a polarization distribution, toward a workpiece. An adaptive structure can be positioned in a path of the radiation beam and can have a plurality of independently controllable and selectively radiation transmissible elements, each configured to change at least one of the amplitude distribution, the phase distribution and the polarization distribution of the radiation beam. A controller can be operatively coupled to the adaptive structure to direct the elements of the adaptive structure to change from one state to any of a plurality of available other states. Accordingly, the adaptive structure can provide radiation beams having a variety of continuously variable distributions for a variety of radiation beam characteristics.

45 Claims, 4 Drawing Sheets

U.S. PATENT DOCUMENTS

| | | | |
|---|---|---|---|
| 6,504,644 B1 * | 1/2003 | Sandstrom | 359/291 |
| 6,577,379 B1 | 6/2003 | Boettiger et al. | |
| 6,710,854 B2 * | 3/2004 | Shiraishi et al. | 355/67 |
| 2003/0044693 A1 | 3/2003 | Boettiger et al. | |
| 2003/0044701 A1 | 3/2003 | Boettiger et al. | |

OTHER PUBLICATIONS

Fukuda, H. et al., "Improvement of defocus tolerance in a half–micron optical lithography by the focus latitude enhancement exposure method: Simulation and experiment," J. Vac. Sci. Technol B., vol. 7 No. 4, Jul./Aug. 1989, pp. 667–674.

Texas Instruments Incorporated, "What the Industry Experts Say About Texas Instruments Digital MicroMirror Display (DMD) Technology," 2 pages, Jun. 1994.

Farsari, M. et al., "Microfabrication by use of a spatial light modulator in the ultraviolet: experimental results," Optics Letters, vol. 24, No. 8, pp. 549–550, Apr. 15, 1999; Optical Society Of America, Washington, DC.

Hamamatsu Photonics K.K., "PPM—Programmable Phase Modulator," 4 pages, Sep. 2000, <http://www.hamamatsu.com>.

CRL Opto Limited. LCS2–G Datasheet, 4 pages, 2002, <http://www.crlopto.com/products/datasheets/files/LCS2–datasheet.pdf>.

Boulder Nonlinear Systems, "Liquid Crystal Rotators—Ferroelectric and Nematic," 2 pages, <http://www.bnonlinear.com/papers/rotators.pdf>.

Boulder Nonlinear Systems, "Liquid Crystal Shutters / Variable Optical Attenuaters—Ferroelectric and Nematic," 2 pages, <http://www.bnonlinear.com/papers/shutters.pdf>.

Boulder Nonlinear Systems, "512×512 Multi–level/Analog Liquid Crystal Spatial Light Modulator," 2 pages, <http://www.bnonlinear.com/papers/512SLM.pdf>.

Boulder Nonlinear Systems, "256×256 Multi–level/Analog Liquid Crystal Spatial Light Modulator," 2 pages, <http://www.bnonlinear.com/papers/256SLM.pdf>.

Digital Optics Corporation, "Pattern Generators," 1 page, 2002, retrieved from the Internet on Jul. 30, 2003, <http://www.digitaloptics.com/products_ind.asp?pid=55>.

Micro–Optics, Inc., "Polarzation Maintaining Faraday Rotator (PMFR)," 1 page, retrieved from the Internet on Jul. 30, 2003, <http://www.microopticsinc.com/PMFR.html>.

* cited by examiner

METHODS AND SYSTEMS FOR CONTROLLING RADIATION BEAM CHARACTERISTICS FOR MICROLITHOGRAPHIC PROCESSING

TECHNICAL FIELD

The present invention relates generally to methods and systems for controlling radiation beam characteristics, including phase, polarity, and amplitude distributions, during microlithographic processing.

BACKGROUND

Microelectronic features are typically formed in microfeature workpieces (including semiconductor wafers) by selectively removing material from the wafer and filling in the resulting openings with insulative, semiconductive and/or conductive materials. One typical process includes depositing a layer of radiation-sensitive photoresist material on the wafer, then positioning a patterned mask or reticle over the photoresist layer, and then exposing the masked photoresist layer to a selected radiation. The wafer is then exposed to a developer, such as an aqueous base or a solvent. In one case, the photoresist layer is initially generally soluble in the developer, and the portions of the photoresist layer exposed to the radiation through patterned openings in the mask change from being generally soluble to being generally resistant to the developer (e.g., so as to have low solubility). Alternatively, the photoresist layer can be initially generally insoluble in the developer, and the portions of the photoresist layer exposed to the radiation through the openings in the mask become more soluble. In either case, the portions of the photoresist layer that are resistant to the developer remain on the wafer, and the rest of the photoresist layer is removed by the developer to expose the wafer material below.

The wafer is then subjected to etching or metal deposition processes. In an etching process, the etchant removes exposed material, but not material protected beneath the remaining portions of the photoresist layer. Accordingly, the etchant creates a pattern of openings (such as grooves, channels, or holes) in the wafer material or in materials deposited on the wafer. These openings can be filled with insulative, conductive, or semiconductive materials to build layers of microelectronic features on the wafer. The wafer is then singulated to form individual chips, which can be incorporated into a wide variety of electronic products, such as computers and other consumer or industrial electronic devices.

As the size of the microelectronic features formed in the wafer decreases (for example, to reduce the size of the chips placed in electronic devices), the size of the features formed in the photoresist layer must also decrease. In some processes, the dimensions (referred to as critical dimensions) of selected features are evaluated as a diagnostic measure to determine whether the dimensions of other features comply with manufacturing specifications. Critical dimensions are accordingly selected to be the most likely to suffer from errors resulting from any of a number of aspects of the foregoing process. Such errors can include errors generated by the radiation source and/or the optics between the radiation source and the mask. The errors can also be generated by the mask, by differences between masks, and/or by errors in the etch process. The critical dimensions can also be affected by errors in processes occurring prior to or during the exposure/development process, and/or subsequent to the etching process, including variations in deposition processes, and/or variations in material removal processes, e.g., chemical-mechanical planarization processes.

One general approach to correcting lens aberrations in wafer optic systems (disclosed in U.S. Pat. No. 5,142,132 to McDonald et al.) is to reflect the incident radiation from a deformable mirror, which can be adjusted to correct for the aberrations in the lens optics. However, correcting lens aberrations will not generally be adequate to address the additional factors (described above) that can adversely affect critical dimensions. Accordingly, another approach to addressing some of the foregoing variations and errors is to interpose a gradient filter between the radiation source and the mask to spatially adjust the intensity of the radiation striking the wafer. Alternatively, a thin film or pellicle can be disposed over the mask to alter the intensity of light transmitted through the mask. In either case, the filter and/or the pellicle can account for variations between masks by decreasing the radiation intensity incident on one portion of the mask relative to the radiation intensity incident on another.

One drawback with the foregoing arrangement is that it may be difficult and/or time-consuming to change the gradient filter and/or the pellicle when the mask is changed. A further drawback is that the gradient filter and the pellicle cannot account for new errors and/or changes in the errors introduced into the system as the system ages or otherwise changes.

Another approach to addressing some of the foregoing drawbacks is to provide a pixilated, diffractive optical element (DOE) in place of a fixed geometry diffractive device. The pixilated DOE typically includes an array of electrically addressable pixels, each of which has an "on" state and a "off" state. Pixels in the on state transmit light and pixels in the off state do not. Accordingly, such DOEs can be repeatedly reprogrammed to generate new patterns, allowing the user to avoid the cost associated with generating a new diffractive element for each new microfeature workpiece design. However, a drawback with this approach is that toggling the pixels between two binary states may not provide adequate control over the radiation impinging on the microlithographic workpiece, which can in turn result in sub-standard or otherwise unacceptable workpieces.

DETAILED DESCRIPTION

A. Introduction

Figure 1:
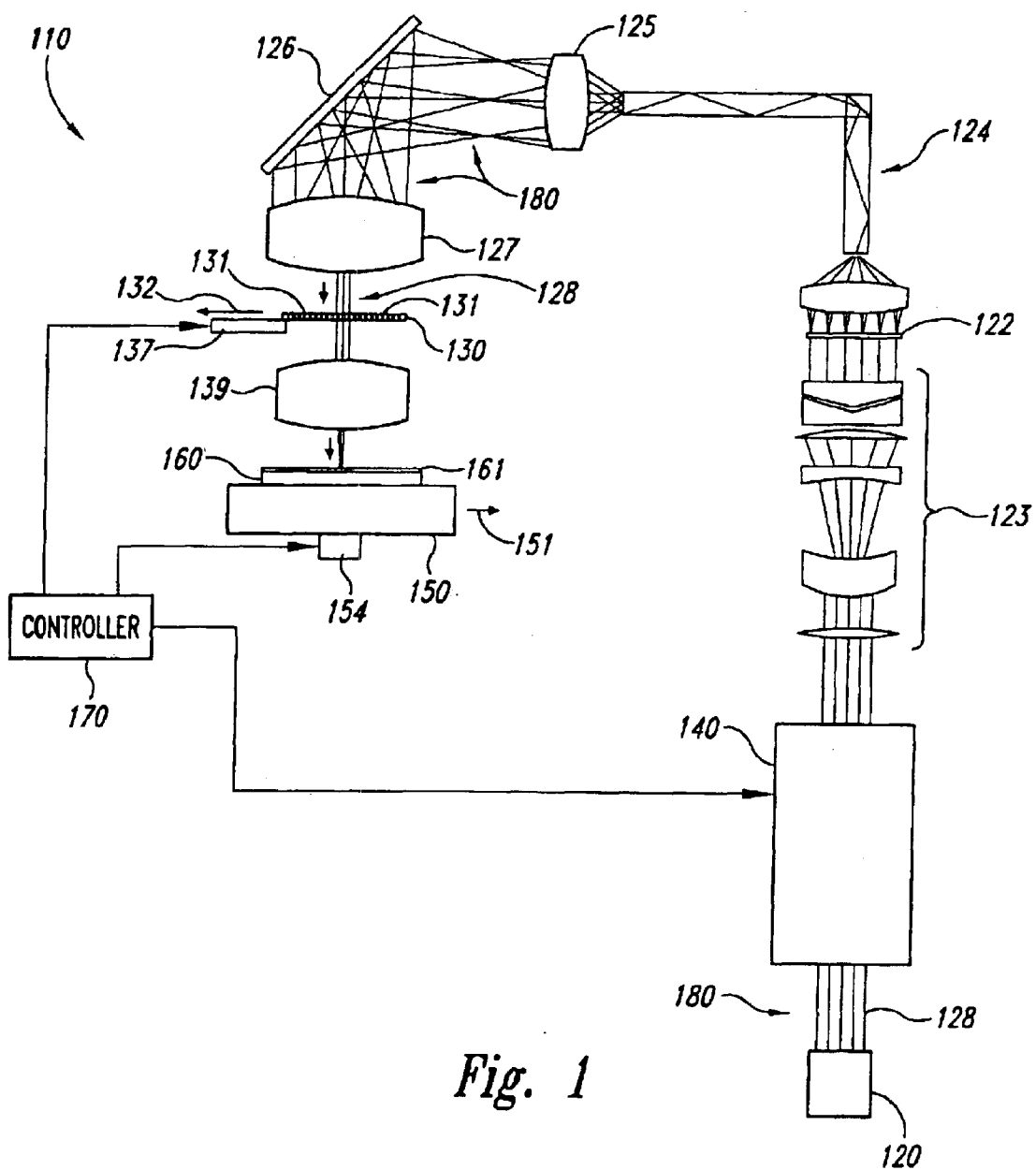
FIG. 1 is a partially schematic view of an apparatus for irradiating microlithographic workpieces in accordance with an embodiment of the invention.

The present disclosure describes methods and apparatuses for controlling the characteristics of radiation directed toward a microlithographic workpiece. The term "microlithographic workpiece" is used throughout to include workpieces upon which and/or in which submicron circuits or components, data storage elements or layers, vias or conductive lines, micro-optic features, micromechanical features, and/or microbiological features are or can be fabricated using microlithographic techniques. In any of these embodiments, the workpiece is formed from suitable materials, including ceramics, and may support layers and/or other formations of other materials, including but not limited to metals, dielectric materials and photoresists.

An apparatus in accordance with one aspect of the invention includes a workpiece support having a support surface positioned to carry a microlithographic workpiece. A source of radiation can be positioned to direct a radiation beam along a radiation path toward the workpiece support, with the radiation beam having an amplitude distribution, a phase distribution and a polarization distribution. An adaptive structure can be positioned in the radiation path and can have a plurality of independently controllable and selectively radiation transmissible elements, each configured to receive a portion of the radiation beam and change from one state to any of a plurality of available other states to change at least one of the amplitude distribution, the phase distribution, and the polarization distribution of the radiation beam. A controller can be operatively coupled to the adaptive structure to direct the elements of the adaptive structure to change from the one state to the one of the plurality of other states.

In a further particular aspect of the invention, the plurality of available other states can include a generally continuous spectrum of other states. The controller can be electrically coupled to each of the elements and can be configured to apply a variable voltage to each element to independently change a state of each element from the one state to any of the plurality of available other states.

A method in accordance with another aspect of the invention includes directing a radiation beam from a radiation source along a radiation path, with the radiation beam having an amplitude distribution, a phase distribution and a polarization distribution as a function of location in a plane generally transverse to the radiation path. The method can further include impinging the radiation beam on an adaptive structure, and changing a state of at least a portion of the adaptive structure from one state to another state to independently change at least two distributions. The radiation beam can be directed away from the adaptive structure along the radiation path to impinge on the microlithographic workpiece.

In a method in accordance with another aspect of the invention, changing a state of at least a portion of the adaptive structure can include directing an electrical signal to at least one of a plurality of electrically addressable elements arranged in an array of columns and rows. In a further aspect of the invention, the radiation beam can be passed through a reticle positioned between the adaptive structure and the microlithographic workpiece.

B. Methods and Apparatuses in Accordance with Embodiments of the Invention

Many specific details of certain embodiments of the invention are set forth in the following description and in FIGS. 1–6 to provide a thorough understanding of these embodiments. One skilled in the art, however, will understand that the present invention may have additional embodiments, and that the invention may be practiced without several of the details described below.

FIG. 1 schematically illustrates an apparatus 110 for controllably irradiating a microlithographic workpiece 160 in accordance with an embodiment of the invention. The apparatus 110 can include a radiation source 120 that directs an electromagnetic radiation beam 128 along a radiation path 180 toward the microlithographic workpiece 160. The apparatus 110 can further include an adaptive structure 140 that adjusts the characteristics of the incoming radiation beam 128. As described in greater detail below, these characteristics can include the spatial distribution of amplitude (intensity), phase, and/or polarization across the beam 128. Optionally, the radiation beam 128 can then pass through a lens system 123 configured to shape and/or magnify the radiation emitted by the source 120. Optionally, the apparatus 110 can further include a diffractive element 122 to diffuse the radiation, and a light tube 124 positioned to generate a plurality of images of the radiation source 120. The light tube 124 and/or or a sizing lens 125 can size the radiation beam 128, which can then be directed by a mirror 126 through a focusing lens 127 to a reticle or mask 130 along a reticle radiation path segment 181a.

The reticle 130 can include reticle apertures 131 through which the radiation passes to form an image on the microlithographic workpiece 160. The radiation can pass through a reduction lens 139 which reduces the image pattern defined by the reticle to a size corresponding to the size of the features to be formed on the microlithographic workpiece 160. The radiation beam 128 then impinges on a radiation-sensitive material 161 (e.g., a photoresist layer) of the microlithographic workpiece 160 to form an image on the material 161. In one embodiment, the beam 128 impinging on the material 161 can have a generally rectangular shape with a width of from about 5 mm. to about 8 mm. and a length of about 26 mm. In other embodiments, the beam 128 incident on the layer 161 can have other shapes and sizes. In one embodiment, the radiation can have a wavelength selected from the following values: 13 nanometers, 157 nanometers, 193 nanometers, 248 nanometers and 365 nanometers. In other embodiments, the wavelength can have a value below, above or between these values, provided the wavelength is suitable for exposing the material 161 on the microlithographic workpiece 160.

The microlithographic workpiece 160 can be carried by a workpiece support 150. In one embodiment (a scanner arrangement), the workpiece support 150 moves along a workpiece support path 151, and the reticle 130 moves in the opposite direction along a reticle path 132 to scan the image produced by the reticle 130 across the material 161 while the position of the radiation beam 128 remains fixed. Accordingly, the workpiece support 150 can be coupled to a support actuator 154 and the reticle 130 can be coupled to a reticle actuator 137.

As the reticle 130 moves opposite the microlithographic workpiece 160, the radiation source 120 can flash to irradiate successive portions of the microlithographic workpiece 160 with corresponding successive images produced by the reticle 130, until an entire field of the microlithographic workpiece 160 is scanned. In one embodiment, the radiation source 120 can flash at a rate of about 20 cycles during the time required for the microlithographic workpiece 160 to move by one beam width (e.g., by from about 5 mm. to about 8 mm.). In other embodiments, the radiation source 120 can flash at other rates. In one embodiment, the radiation source 120 can flash at the same rate throughout the scanning process (assuming the reticle 130 and the workpiece 150 each move at a constant rate) to uniformly irradiate each field. In another embodiment, the radiation source 120 can deliver a continuous radiation beam 128. In either embodiment, each field can include one or more dice or chips, and in other embodiments, each field can include other features.

In another embodiment (a stepper arrangement), the radiation beam 128 and the reticle 130 can expose an entire field of the microlithographic workpiece 160 in one or more flashes, while the reticle 130 and the workpiece support 150 remain in a fixed transverse position relative to the radiation path 180. After the field has been exposed, the reticle 130 and/or the workpiece support 150 can be moved transverse to the radiation path 180 to align other fields with the radiation beam 128. This process can be repeated until each of the fields of the microlithographic workpiece 160 is exposed to the radiation beam 128. Suitable scanner and stepper devices are available from ASML of Veldhoven, The Netherlands; Canon USA, Inc., of Lake Success, N.Y.; and Nikon, Inc. of Tokyo, Japan.

In a further aspect of the foregoing embodiments, a controller 170 can be operatively coupled to the reticle 130 (or the reticle actuator 137) and the workpiece support 150 (or the support actuator 154). Accordingly, the controller 170 can include a processor, microprocessor or other device that can automatically (with or without user input) control and coordinate the relative movement between these elements. The controller 170 can also be coupled to the adaptive structure 140 to control the characteristics of the radiation beam 128, as described in greater detail below.

Figure 2:
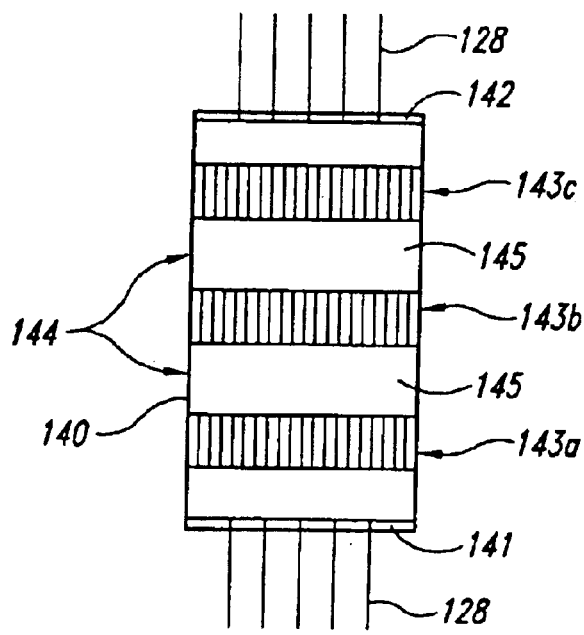
FIG. 2 is a partially schematic illustration of an adaptive structure for controlling characteristics of the radiation directed to a microlithographic workpiece in accordance with an embodiment of the invention.

FIG. 2 is a partially schematic illustration of an adaptive structure 140 configured in accordance with an embodiment of the invention. In one aspect of this embodiment, the adaptive structure 140 includes an entrance aperture 141 sized and positioned to receive the radiation beam 128, and an exit aperture 142 sized and positioned to emit the radiation beam 128. The adaptive structure 140 further includes one or more adaptive portions 143 (three are shown schematically in FIG. 2 as a first adaptive portion 143a, a second adaptive portion 143b, and a third adaptive portion 143c) positioned between the entrance aperture 141 and the exit aperture 142. In one embodiment, the adaptive portions 143 are spaced apart by gaps 144 filled with index-matching fluid 145 to reduce the likelihood for reflection at the interfaces between the adaptive portions 143 and the gaps 144. In another embodiment, the gaps 144 can be eliminated, and the adaptive portions 143 can abut against each other.

In either of the foregoing embodiments, each adaptive portion 143 can change from one state to another to change the distribution of a particular characteristic of the radiation beam 128. For example, in one embodiment, the first adaptive portion 143a can be configured to change an amplitude or intensity distribution of the radiation beam 128. The second adaptive portion 143b can be configured to change a polarity distribution of the radiation beam 128, and the third portion 143c can be configured to change a phase distribution of the radiation beam 128. In other embodiments, one or more of the adaptive portions 143a–143c can change a different characteristic of the radiation beam 128, and/or the relative positions of the adaptive portions 143a–143c can be changed. In still further embodiments, one or more of the adaptive portions 143a–143c can be eliminated. In any embodiment that includes more than one adaptive portion 143, each adaptive portion 143 can be independently controlled to alter the radiation beam characteristic for which that particular adaptive portion 143 is tailored, as described in greater detail below.

Figure 3:
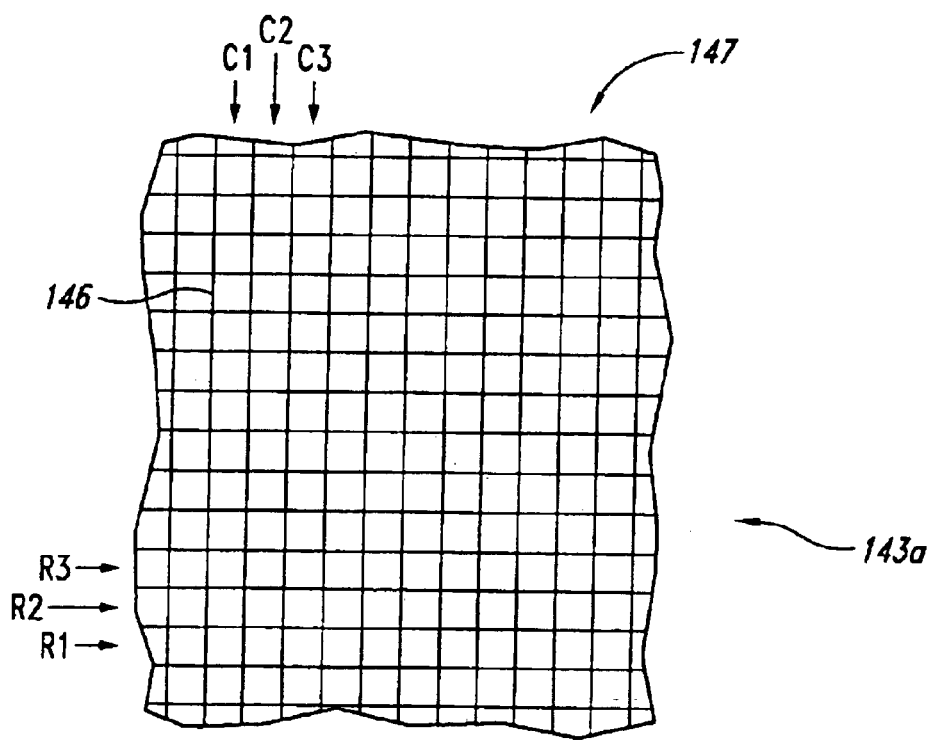
FIG. 3 is a partially schematic plan view of a portion of the adaptive structure shown in FIG. 2.

FIG. 3 is a partially schematic illustration of the first portion 143a described above with reference to FIG. 2, viewed in a direction generally parallel with the radiation path 180. In one aspect of an embodiment shown in FIG. 3, the first portion 143a can include a plurality of individually controllable adaptive elements 146 positioned in a generally flat layer. In another aspect of the embodiment, each adaptive element 146 can have a generally rectilinear shape, e.g., a square shape. In other embodiments, each adaptive element 146 can have another shape, e.g., a hexagonal shape or a circular shape. In a further aspect of an embodiment shown in FIG. 2, the adaptive elements 146 can be arranged in an array 147, for example, a generally rectilinear array 147. Accordingly, the adaptive elements 146 can be arranged in rows (e.g., rows R1, R2, R3 . . . ) and columns (e.g., columns C1, C2, C3 . . . ). In other embodiments, the adaptive elements 146 can be arranged in other patterns. In any of these embodiments, each adaptive element 146 can receive a portion of the incoming radiation beam 128 (FIG. 2), and can control a selected characteristic of the radiation beam 128. For example, in one embodiment, the first portion 143a can be configured to change the amplitude or intensity distribution of the incoming radiation beam 128. Accordingly, the first portion 143a can include a spatial light modulator, such as a model LC-SLM available from Boulder Non-Linear Systems of Lafayette, Colo. or a model LCS2-9 available from CRL Opto Limited of Dunfirmline, Scotland.

In other embodiments, the first portion 143a can be configured to modify a polarization of the incoming light beam 128. Accordingly, the first portion 143a can include a plurality of adaptive elements 146, each of which includes a Faraday rotator, such as a ferro-electric liquid crystal rotator or a nematic liquid crystal rotator available from Boulder Non-Linear Systems of Lafayette, Colo. In still another embodiment, the first portion 143a can be configured to control a phase distribution of the radiation beam 128, and can accordingly include adaptive elements 146 made of quartz or other suitable materials. In a particular embodiment, the first portion 143a can include an array of electro-optic modulators, for example, a parallel aligned nematic liquid crystal spatial light modulator, available from Hamamatsu Corporation of Bridgewater, N.J. In any of these embodiments, each adaptive element 146 can control the characteristic of the radiation beam 128 to have a value selected from a generally continuous spectrum of available values, as described below with reference to FIG. 4.

Figure 4:
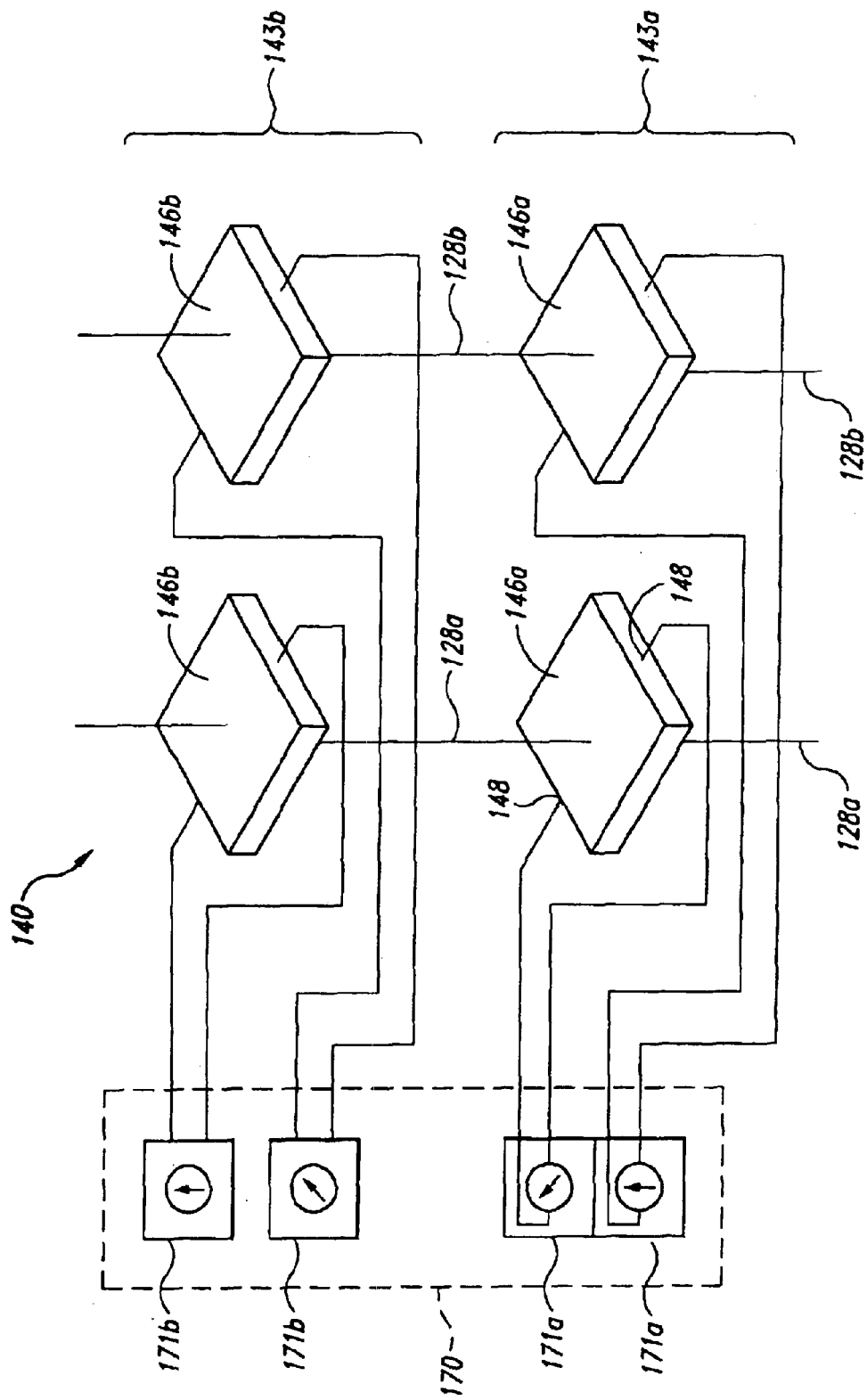
FIG. 4 is a partially schematic illustration of an arrangement for controlling elements of an adaptive structure in accordance with an embodiment of the invention.

FIG. 4 is a partially schematic illustration of the controller 170 and sections of the first and second portions 143a, 143b of the adaptive structure 140, configured in accordance with an embodiment of the invention. For purposes of illustration, two first adaptive elements 146a (of the first portion 143a) and two second adaptive elements 146b (of the second portion 143b) are depicted in FIG. 4. In one aspect of this embodiment, the first adaptive elements 146a are controlled independently of the second adaptive elements 146b. In a further aspect of this embodiment, each first adaptive element 146a can be controlled independently of the other first adaptive elements 146a, and each second adaptive element 146b can be controlled independently of the other second adaptive elements 146b. Accordingly, the controller 170 can include a first element controller 171a for each of the first adaptive elements 146a, and a second element controller 171b for each of the second adaptive elements 146b.

The element controllers 171a, 171b (referred to collectively as element controllers 171) can be configured not only to control each adaptive element 146 independently of its neighbors, but can also selectively establish the state of each adaptive element 146 from a spectrum of more than two available states. In particular, each element controller 171 can control the corresponding adaptive element 146 not just between an "off" state and an "on" state, but between an off state and a variety of on states. For example, when the adaptive element 146 is configured to control an intensity of the light beam 128, the corresponding element controller 171 can vary a transmissivity of the adaptive element 146 over a variety of states between completely open (e.g., fully transmissive) and completely closed (e.g., non-transmissive). When the adaptive element 146 is configured to vary the polarization of the light beam 128, the corresponding element controller 171 can adjust the state of the adaptive element 146 to produce any of a variety of polarization values between, for example 0° and 90°. When the adaptive element 146 is configured to control a phase of the incoming light beam 128, the corresponding element controller 171 can adjust the state of the adaptive element 146 to produce a phase shift (compared with neighboring adaptive elements) having any of a variety of phase shift values along a spectrum of such values, for example, from −180° to +180°.

In any of the foregoing embodiments, each adaptive element 146 can be electrically activated to change from one state to another, and each corresponding element controller 171 can vary an electrical potential provided to the adaptive element 146. Accordingly, each adaptive element 146 can include at least one electrical input 148 (two are shown for each of the adaptive elements 146 shown in FIG. 4). As the voltage applied across each adaptive element 146 is varied, the corresponding characteristic (e.g., amplitude, polarization, or phase) controlled by that adaptive element 146 is also varied. By selecting the voltage applied by the element controller 171 to the corresponding adaptive element 146 from a spectrum of available voltages, an operator (with or without assistance from a computer-based routine) can adjust the radiation beam characteristic controlled by that adaptive element 146 to have a corresponding value. Adjacent adaptive elements 146 can be controlled in a generally similar manner to control the overall distribution of the selected characteristic over the cross-section of the radiation beam 128. In other embodiments, the adaptive elements 146 can receive other inputs that also produce continuously variable state changes in the parameters described above. In one embodiment, the characteristic controlled by each adaptive element 146 does not vary as a function of time for a given state. Accordingly, the characteristic can be controlled to have no temporal variation at each state, which can increase the predictability of the results produced with the adaptive structure 140.

In one embodiment, the controller 170 can include programmable, computer-readable media (e.g., software routines) configured to receive input signals from a user and direct appropriate output signals to the adaptive structure 140. In other embodiments, the controller 170 can have other arrangements. In any of these embodiments, the controller 170 can change the state of the adaptive structure 140 so that the same adaptive structure 140 can be used to provide radiation beams 128 having a wide variety of characteristics.

One feature of an embodiment of the apparatus 110 described above with reference to FIGS. 1–4 is that the adaptive structure 140 can provide for more precise control of the amplitude, polarity, and/or phase distributions of the radiation beam 128 because the controller 170 can direct each of the adaptive elements 146 to take on a state selected from a generally continuous spectrum of available states. This degree of precision can improve the quality of the microlithographic workpiece 160. For example, by providing a radiation beam 128 having an amplitude, polarization and/or phase distribution that varies continuously from one region to another, the integrity of the pattern projected onto the material 161 can be improved compared with patterns available via conventional methods. This technique can also improve the depth of focus of the radiation beam 128 impinging on the radiation sensitive material 161, and can reduce the sensitivity of the material 161 to variations in exposure time during subsequent processing steps. The reduction in sensitivity to exposure time can be particularly important when the thickness of the radiation sensitive material 161 disposed on the microlithographic workpiece 160 varies. In such instances, the thick and thin regions of the radiation sensitive material 161 can receive similar exposure times without overexposing thin regions and/or underexposing thick regions.

Another feature of an embodiment of the adaptive structure 140 described above with reference to FIGS. 1–4 is that by using the foregoing techniques the adaptive structure 140 can independently vary two or more characteristics of the radiation beam 128. For example, the adaptive structure 140 can be used to independently vary any two of the amplitude distribution, the phase distribution, and the polarization distribution of the radiation beam 128, or can independently vary all three of these distributions. An advantage of this arrangement is that an operator can have a greater degree of control over the characteristics of the radiation beam 128 impinging on the radiation sensitive material 161. For example, the operator can control the phase distribution of the radiation beam 128 without imposing unintended changes on the polarization distribution of the beam 128, and vice versa. Accordingly, this arrangement can be particularly advantageous for applications where a conventional device might alter one characteristic of the radiation beam as an uncontrolled byproduct of varying a target characteristic.

Figure 5:
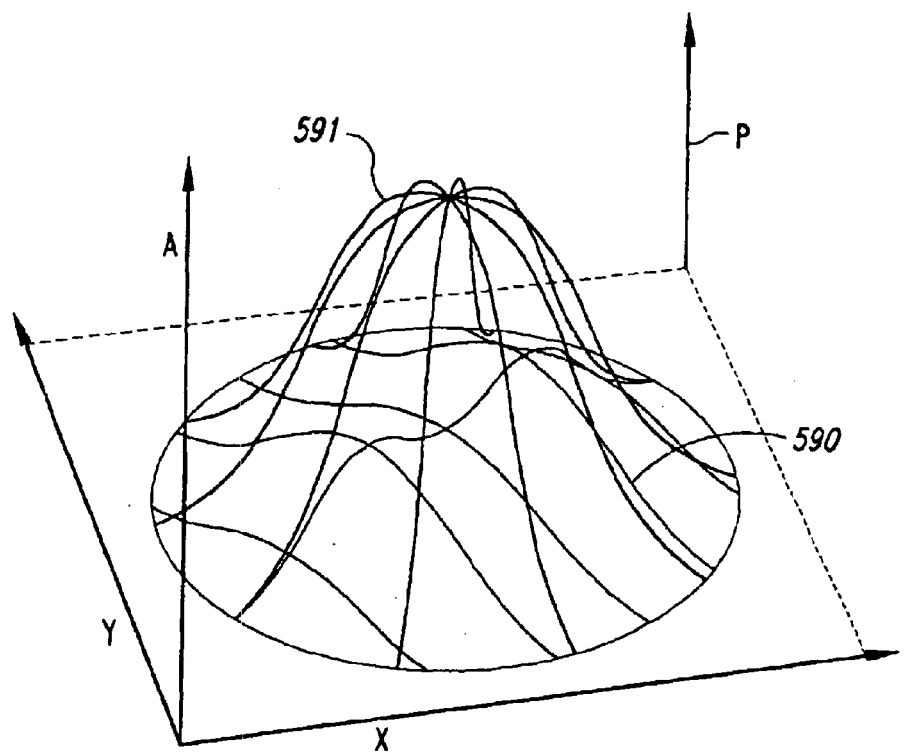
FIG. 5 is a partially schematic illustration of an adaptive structure that includes reflective elements in accordance with another embodiment of the invention.

FIG. 5 is a graph illustrating distributions of two independently variable parameters of a radiation beam 128 (FIG. 1), controlled in accordance with an embodiment of the invention. The X and Y axes shown in FIG. 5 define a plane generally transverse to the radiation path 180 (FIG. 1), and the vertical axes A and P represent amplitude and phase values, respectively. The radiation beam 128 can have an amplitude distribution 590 with two peaks and a phase distribution 591 with a single peak. In other embodiments, the amplitude distribution 590 and the phase distribution 691 can have other, independently controlled, shapes. In still further embodiments, other characteristics of the radiation beam 128 (e.g., the polarization of the beam 128) can also be controlled independently of the phase distribution 591 and/or the amplitude distribution 590.

Figure 6:
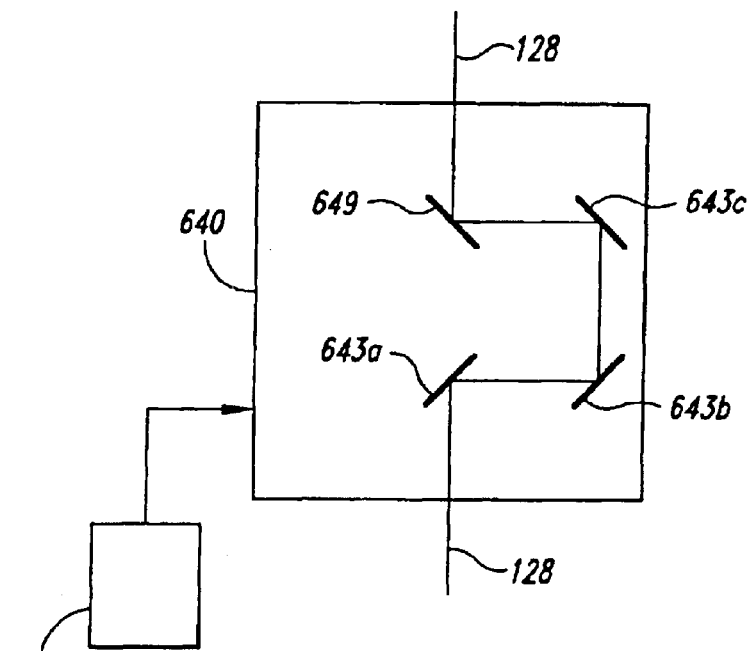
FIG. 6 is a graph illustrating the distributions of two characteristics of a radiation beam produced using methods and apparatuses in accordance with embodiments of the invention.

In other embodiments, the apparatus 110 described above with reference to FIG. 1 can include other adaptive structures that also independently control two or more characteristics of the radiation beam 128. For example, in an embodiment shown in FIG. 6, an adaptive structure 640 includes multiple reflective adaptive portions 643 (three are shown in FIG. 6 as a first adaptive portion 643*a*, a second adaptive portion 643*b*, and a third adaptive portion 643*c*). Each of the adaptive portions 643 can include a plurality of reflective elements having an orientation or other attribute that is independently controlled by a controller 670. The adaptive structure 640 can also include a directional mirror 649 positioned to align the incoming and outgoing portions of the radiation beam 128 along a straight line axis. In other embodiments, the directional mirror 649 can be eliminated. In any of these embodiments, the adaptive portions 643 can control the amplitude, phase, and/or polarization distribution of the radiation beam 128. In a particular embodiment, for which one of the adaptive portions 643 controls the amplitude distribution, the adaptive portion 643 can include a structure generally similar to that described in pending U.S. patent application Ser. No. 09/945,316, incorporated herein in its entirety by reference. In other embodiments, such an adaptive portion can have other arrangements.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

We claim:

1. An apparatus for controlling characteristics of radiation directed to a microlithographic workpiece, comprising:
   a workpiece support having a support surface positioned to carry a microlithographic workpiece;
   a source of radiation positioned to direct a radiation beam along a radiation path toward the workpiece support, the radiation beam having an amplitude distribution, a phase distribution and a polarization distribution;
   an adaptive structure positioned in the radiation path between the source of radiation and the workpiece support, the adaptive structure having a plurality of independently controllable and selectively radiation transmissible elements, each configured to receive a portion of the radiation beam and change from one state to any of a plurality of available other states to chance at least one of the amplitude distribution, the phase distribution and the polarization distribution of the radiation beam;
   a reticle disposed between the adaptive structure and the workpiece support; and
   a controller operatively coupled to the adaptive structure to direct the elements of the adaptive structure to change from the one state to the one of the plurality of other states.

2. The apparatus of claim 1 wherein the controller is electrically coupled to each of the elements and is configured to apply a variable voltage to each element to independently change a state of each element from one state to any of a plurality of available other states.

3. The apparatus of claim 1 wherein the adaptive structure includes a plurality of Faraday rotator elements, with each Faraday rotator element coupled to the controller, and wherein the controller is configured to independently apply a variable voltage to each Faraday rotator element to change a state of each Faraday rotator element from one state to any of a plurality of available other states, with each Faraday rotator element transmitting radiation at a first polarization when in the one state, and transmitting radiation at a corresponding plurality of other polarizations when in any of the other states.

4. The apparatus of claim 1 wherein the adaptive structure includes a plurality of quartz pixel elements with each pixel element coupled to the controller, and wherein the controller is configured to independently apply a variable voltage to each pixel element to change a state of each pixel element from one state to any of a plurality of available other states, with each pixel element transmitting radiation at a first phase when in the one state, and transmitting radiation at a corresponding plurality of other phases when in any of the other states.

5. The apparatus of claim 1 wherein the elements of the adaptive structure have a non-time varying transmissibility in each of the states.

6. The apparatus of claim 1, further comprising a reticle disposed between the adaptive structure and the workpiece support, at least one of the reticle and the workpiece support being movable relative to the other.

7. The apparatus of claim 1 wherein the adaptive structure includes first, second and third arrays of electrically addressable elements, each array intersecting the radiation path and extending in two orthogonal directions generally normal to the radiation path, the elements of the first array being configured to receive first electrical signals to change state and alter the amplitude distribution of the radiation beam, the elements of the second array being configured to receive second electrical signals to change state and alter the phase distribution of the radiation beam, the elements of the third array being configured to receive third electrical signals to change state and alter a polarization distribution of the radiation beam.

8. The apparatus of claim 1 wherein the adaptive structure includes a plurality of electrically addressable elements arranged in an array of columns and rows.

9. The apparatus of claim 1 wherein the plurality of available other states include a generally continuous spectrum of other states.

10. An apparatus for controlling characteristics of radiation directed to a microlithographic workpiece, comprising:
    a workpiece support having a support surface positioned to carry a microlithographic workpiece;
    a source of radiation positioned to direct a radiation beam along a radiation path toward the workpiece support, the radiation beam having a phase distribution and a polarization distribution;
    an adaptive structure positioned in the radiation path between the source of radiation and the workpiece support, the adaptive structure having a plurality of independently controllable elements, each configured to receive a portion of the radiation beam and change from one state to any of a plurality of available other states to change at least one of the phase distribution and the polarization distribution of the radiation beam;
    a reticle disposed between the adaptive structure and the workpiece support; and
    a controller operatively coupled to the adaptive structure to direct the elements of the adaptive structure to change from the one state to the one of the plurality of other states.

11. The apparatus of claim 10 wherein the adaptive structure is at least partially transmissive to the radiation beam to allow at least a portion of the radiation beam to pass through the adaptive structure.

12. The apparatus of claim 10 wherein the adaptive structure includes a plurality of reflective elements.

13. The apparatus of claim 10 wherein the adaptive structure includes a plurality of Faraday rotator elements, with each Faraday rotator element coupled to the controller, and wherein the controller is configured to independently apply a variable voltage to each Faraday rotator element to change a state of each Faraday rotator element from one state to any of a plurality of available other states, with each Faraday rotator element transmitting radiation at a first polarization when in the one state, and transmitting radiation at a corresponding plurality of other polarizations when in any of the other states.

14. The apparatus of claim 10 wherein the adaptive structure includes a plurality of quartz pixel elements with each pixel element coupled to the controller, and wherein the controller is configured to independently apply a variable voltage to each pixel element to change a state of each pixel element from one state to any of a plurality of available other states, with each pixel element transmitting radiation at a first phase when in the one state, and transmitting radiation at a corresponding plurality of other phases when in any of the other states.

15. An apparatus for controlling characteristics of radiation directed to a microlithographic workpiece, comprising:
a workpiece support having a support surface positioned to carry a microlithographic workpiece;
a source of radiation positioned to direct a radiation beam along a radiation path toward the workpiece support, the radiation beam having an amplitude distribution, a phase distribution and a polarization distribution;
an adaptive structure positioned in the radiation path between the source of radiation and the workpiece support, the adaptive structure being configured to receive the radiation beam and independently change any two of the amplitude distribution, the phase distribution and the polarization distribution of the radiation beam; and
a reticle disposed between the adaptive structure and the workpiece support; and
a controller operatively coupled to the adaptive structure to direct the adaptive structure to change from one state to another state.

16. The apparatus of claim 15 wherein the adaptive structure is configured to change from one state to any of a plurality of available other states to change at least two of the amplitude distribution, the phase distribution and the polarization distribution.

17. The apparatus of claim 15 wherein the adaptive structure includes a plurality of elements, with each element coupled to the controller, and wherein the controller is configured to apply a variable voltage to each element to independently change a state of each element from a first element state to any of a plurality of available second element states.

18. The apparatus of claim 15 wherein the adaptive structure includes a plurality of Faraday rotator elements, with each Faraday rotator element coupled to the controller, and wherein the controller is configured to apply a variable voltage to each Faraday rotator element to independently change a state of each Faraday rotator element from a first element state to any of a plurality of available second element states, with each Faraday rotator element transmitting radiation at a first polarization when in the first element state, and transmitting radiation at a corresponding plurality of second polarizations when in any of the second element states.

19. The apparatus of claim 15 wherein the adaptive structure includes a plurality of quartz pixel elements with each pixel element coupled to the controller, and wherein the controller is configured to apply a variable voltage to each pixel element to independently change a state of each pixel element from a first element state to any of a plurality of available second element states, with each pixel element transmitting radiation at a first phase when in the first element state, and transmitting radiation at a corresponding plurality of second phases when in any of the second element states.

20. The apparatus of claim 15, further comprising a reticle disposed between the adaptive structure and the workpiece support, at least one of the reticle and the workpiece support being movable relative to the other.

21. The apparatus of claim 15 wherein the adaptive structure includes at least first and second arrays of independently electrically addressable elements, each array intersecting the radiation path and extending in two orthogonal directions generally normal to the radiation path, the elements of the first array being configured to receive first electrical signals to change state and alter one of the amplitude distribution, the phase distribution and the polarization distribution of the radiation beam, the elements of the second array being configured to receive second electrical signals to change state and alter another of the amplitude distribution, the phase distribution and the polarization distribution of the radiation beam.

22. The apparatus of claim 15 wherein the adaptive structure includes a plurality of electrically addressable elements arranged in an array of columns and rows.

23. The apparatus of claim 15 wherein the adaptive structure includes a plurality of adaptive elements, each being at least partially transmissive to the radiation beam to allow at least a portion of the radiation beam to pass through.

24. The apparatus of claim 15 wherein the adaptive structure includes a plurality of reflective elements.

25. An apparatus for controlling characteristics of radiation directed to a microlithographic workpiece, comprising:
a workpiece support having a support surface positioned to carry a microlithographic workpiece;
a source of radiation positioned to direct a radiation beam along a radiation path toward the workpiece support, the radiation beam having an amplitude distribution, a phase distribution and a polarization distribution in a plane generally transverse to the radiation path;
an adaptive structure positioned in the radiation path between the source of radiation and the workpiece support, the adaptive structure to receive the radiation beam and change from one state to any of a plurality of available other states to independently change each of the amplitude distribution, the phase distribution and the polarization distribution from a first distribution to a second distribution, with each second distribution selected from a generally continuous spectrum of second distributions;
a controller electrically coupled to the adaptive structure to direct electrical signals to the adaptive structure to change the state of the adaptive structure; and
a reticle positioned between the adaptive structure and the workpiece support, with at least one of the reticle and the workpiece support being movable relative to the other.

26. The apparatus of claim 25 wherein the adaptive structure includes a plurality of adaptive elements, each being at least partially transmissive to the radiation beam to allow at least a portion of the radiation beam to pass through.

27. The apparatus of claim 25 wherein the adaptive structure includes a plurality of reflective elements.

28. A method for controlling characteristics of radiation directed to a microlithographic workpiece, comprising:
directing a radiation beam from a radiation source along a radiation path, the radiation beam having an amplitude distribution, a phase distribution, and a polarization distribution as a function of location in a plane generally transverse to the radiation path;
impinging the radiation beam on an adaptive structure positioned in the radiation path;
changing a state of at least one element of the adaptive structure from one state to any of a plurality of available other states to change at least one of the amplitude distribution, the phase distribution and the polarization distribution;

passing the radiation beam through and away from the at least one element of the adaptive structure;

passing the radiation beam through a reticle positioned between the adaptive structure and the microlithographic workpiece; and impinging the radiation beam directed away from the adaptive structure on the microlithographic workpiece.

29. The method of claim 28 wherein changing a state includes changing a state to any of a plurality of available other states, all of which correspond to different amplitude distributions, or different phase distributions or different polarization distributions.

30. The method of claim 28, further comprising:

passing the radiation beam through first, second and third arrays of electrically addressable elements, each array intersecting the radiation path and extending in two orthogonal directions generally normal to the radiation path;

directing first electrical signals to the first array to change a state of the first array and alter the amplitude distribution of the radiation beam;

directing second electrical signals to the second array to change a state of the second array and alter the phase distribution of the radiation beam; and directing third electrical signals to the third array to change a state of the third array and alter a polarization distribution of the radiation beam.

31. The method of claim 28 wherein changing a state of at least one element of the adaptive structure includes directing an electrical signal to at least one of a plurality of electrically addressable elements arranged in an array of columns and rows.

32. The method of claim 28 wherein changing a state of at least one element of the adaptive structure includes changing from one state to any of a plurality of other states in a generally continuous spectrum of other states.

33. The method of claim 28, further comprising:

passing the radiation beam through a reticle positioned between the adaptive structure and the microlithographic workpiece; and moving at least one of the reticle and the microlithographic workpiece relative to the other while impinging the radiation beam on the microlithographic workpiece.

34. A method for controlling characteristics of radiation directed to a microlithographic workpiece, comprising:

directing a radiation beam from a radiation source along a radiation path, the radiation beam having a phase distribution and a polarization distribution as a function of location in a plane generally transverse to the radiation path;

impinging the radiation beam on an adaptive structure positioned in the radiation path;

changing a state of at least one element of the adaptive structure from one state to any of a plurality of available other states to change at least one of the phase distribution and the polarization distribution;

directing the radiation beam away from the at least one element of the adaptive structure;

passing the radiation beam through a reticle positioned between the adaptive structure and the microlithographic workpiece; and impinging the radiation beam directed away from the adaptive structure on the microlithographic workpiece.

35. The method of claim 34, further comprising passing the radiation beam through the at least one element of the adaptive structure.

36. The method of claim 34, further comprising reflecting the radiation beam from the at least one element of the adaptive structure.

37. The method of claim 34 wherein changing a state includes applying an electrical signal to the at least one element of the adaptive structure.

38. A method for controlling characteristics of radiation directed to a microlithographic workpiece, comprising:

directing a radiation beam from a radiation source along a radiation path, the radiation beam having an amplitude distribution, a phase distribution, and a polarization distribution as a function of location in a plane generally transverse to the radiation path;

impinging the radiation beam on an adaptive structure positioned in the radiation path;

changing a state of each of at least two independently controllable elements of the adaptive structure from one state to another state to independently change at least two of the amplitude distribution, the phase distribution and the polarization distribution;

directing the radiation beam away from the adaptive structure along the radiation path;

passing the radiation beam through a reticle positioned between the adaptive structure and the microlithographic workpiece; and impinging the radiation beam directed away from the adaptive structure on the microlithographic workpiece.

39. The method of claim 38 wherein changing a state of each of at least two independently controllable elements of the adaptive structure includes:

directing one or more first electrical signals to one or more first elements of the adaptive structure to change one of the amplitude distribution, the phase distribution and the polarization distribution;

directing one or more second electrical signals to one or more second elements of the adaptive structure to change another of the amplitude distribution, the phase distribution and the polarization distribution; and passing the radiation beam sequentially through the one or more first elements and then through the one or more second elements.

40. The method of claim 38 wherein changing a state includes changing the state from one state to any of a plurality of available other states.

41. The method of claim 38, further comprising passing the radiation beam through the elements of the adaptive structure.

42. The method of claim 38, further comprising reflecting the radiation beam from the elements of the adaptive structure.

43. The method of claim 38, further comprising:

passing the radiation beam through first, second and third arrays of electrically addressable elements, each array intersecting the radiation path and extending in two orthogonal directions generally normal to the radiation path;

directing first electrical signals to the first array to change a state of the first array and alter the amplitude distribution of the radiation beam;

directing second electrical signals to the second array to change a state of the second array and alter the phase distribution of the radiation beam; and directing third electrical signals to the third array to change a state of the third array and alter a polarization distribution of the radiation beam.

44. A method for controlling characteristics of radiation directed to a microlithographic workpiece, comprising:

directing a radiation beam from a radiation source along a radiation path, the radiation beam having a first amplitude distribution, a first phase distribution and a first polarization distribution as a function of location in a plane generally transverse to the radiation path;

impinging the radiation beam on an adaptive structure positioned in the radiation path;

changing a state of each of a plurality of adaptive elements of the adaptive structure from one state to any of a plurality of available other states to change the first amplitude distribution to a second amplitude distribution, change the first phase distribution to a second phase distribution, and change the first polarization distribution to a second polarization distribution, with each change being independent of the other two;

directing the radiation beam through and away from the adaptive structure along the radiation path;

passing the radiation beam through a reticle positioned between the adaptive structure and the microlithographic workpiece; and impinging the radiation beam directed away from the adaptive structure on the microlithographic workpiece.

45. The method of claim 44, further comprising:

passing the radiation beam through first, second and third arrays of electrically addressable elements, each array intersecting the radiation path and extending in two orthogonal directions generally normal to the radiation path;

directing first electrical signals to the first array to change a state of the first array and alter the amplitude distribution of the radiation beam;

directing second electrical signals to the second array to change a state of the second array and alter the phase distribution of the radiation beam; and directing third electrical signals to the third array to change a state of the third array and alter a polarization distribution of the radiation beam.

* * * * *

UNITED STATES PATENT AND TRADEMARK OFFICE
CERTIFICATE OF CORRECTION

PATENT NO. : 6,894,765 B2
DATED : May 17, 2005
INVENTOR(S) : Jeffrey L. Mackey

It is certified that error appears in the above-identified patent and that said Letters Patent is hereby corrected as shown below:

<u>Column 9,</u>
Line 32, "chance" should be -- change --.

Signed and Sealed this

Fifteenth Day of November, 2005

JON W. DUDAS
*Director of the United States Patent and Trademark Office*